April 16, 1963 K. H. BEERS ETAL 3,086,177

D.C. POWER AMPLIFIER

Filed Oct. 20, 1959 3 Sheets-Sheet 1

INVENTORS
KENNETH H. BEERS
JOHN L. BOWER
BY
Edward A. Sokolski
AGENT

INVENTORS
KENNETH H. BEERS
JOHN L. BOWER

BY Edward A. Sokolski
AGENT

INVENTORS
KENNETH H. BEERS
JOHN L. BOWER
BY Edward A. Sokolski
AGENT 3,086,177

D.C. POWER AMPLIFIER

Kenneth H. Beers, Lakewood, and John L. Bower, Downey, Calif., assignors to North American Aviation, Inc.

Filed Oct. 20, 1959, Ser. No. 847,630
6 Claims. (Cl. 330—18)

This invention relates to a D.-C. power amplifier and more particularly to a D.-C. power amplifier capable of balanced power amplification of bi-polar signals.

Many balanced power amplifiers are available, the most common of these being the conventional push-pull type. Where A.-C. signals alone are to be amplified, a two terminal load may be driven by such an amplifier by utilizing appropriate transformer coupling. Where the amplifier must of necessity handle D.-C. signals and very low frequency A.-C. signals, the transformer method of coupling can no longer be utilized as obviously it will not provide a proper load for a D.-C. or low frequency A.-C. signal. To overcome this problem various "transformer-less" coupling circuits have been devised. These circuits, however, tend to depend upon the similarity of the static and dynamic characteristics of the two valves (which may be transistors or vacuum tubes) used in the output stage. In addition, if the amplifier is to be operated in class "A" condition, i.e., with both electronic valves conducting at all times (throughout the complete cycle of the input signals), then there will be current flow through the output load in the quiescent or no signal condition unless the two valves produce equal and opposite D.-C. current flows through the load with no signal input. Initially obtaining two valves which can be properly biased to have both equal quiescent currents and linear operating characteristics sometimes presents a problem in amplifier design. But, even if balance is initially obtained, changes in operating characteristics after such initial adjustment will often produce some unbalance, necessitating adjustment of the stages.

In transistor push-pull amplifiers, an attempt has been made to obtain balanced operation by utilizing complementary type transistors, one being of the PNP type, the other of the NPN type, the two transistors being chosen to have mating characteristics. A typical such amplifier is described in Patent No. 2,791,644, entitled "Push-Pull Amplifier With Complementary Type Transistors," issued May 7, 1957, inventor G. C. Sziklai. Experience has indicated that the selection of complementary NPN and PNP transistors which can be readily mated together is often a difficult task, especially in a production line type operation where the difficulties in the selection of such transistors can become a major problem. In addition, this problem may always reappear when replacement is necessary in the field.

The device of this invention provides a power amplifier capable of balanced operation with zero current through the load during quiescent class "A" operation comprising identical type electronic valves of either the transistor or vacuum tube type. This is made possible by the utilization of feedback means comprising a resistive network, a D.-C. voltage reference source and an amplifier stage. This feedback means achieves the desired end result by maintaining constant the difference between the current flowing between one of the two power amplifier stages to one of the load terminals and the current flowing between the second amplifier stage and this same load terminal. The two power amplifier stages being of identical types will tend to exhibit very closely similar characteristics, so that the requirement for the adjustment of their output currents for balance will be minimized. This adjustment, however, is accomplished automatically without the requirement for manual adjustment of the bias voltages to the amplifier stages except under extreme conditions or after long periods of operation. The device of the invention is capable of amplifying both D.-C. and A.-C. input signals with zero quiescent current through the load.

It is therefore an object of this invention to provide an improved D.-C. power amplifier.

It is a further object of this invention to enable balanced operation of transistor D.-C. amplifiers without resorting to the use of complementary type transistors.

It is a still further object of this invention to provide means for automatically maintaining balanced operation of a class "A" D.-C. power amplifier over long periods of operation.

It is still another object of this invention to provide a simple yet effective D.-C. power amplifier circuit capable of automatically maintaining zero current through the output load with no signal input.

It is a still further object of this invention to provide improved means for coupling bi-polar signals to a two terminal output load.

Other objects of this invention will become apparent from the following description taken in connection with the accompanying drawing in which—

FIG. 1 is a block diagram illustrating the basic operation of the device of the invention;

FIGS. 2*a*, 2*b*, 2*c*, 2*d* and 2*e* are a series of waveforms illustrating the operation of the device of the invention;

Figure 1:
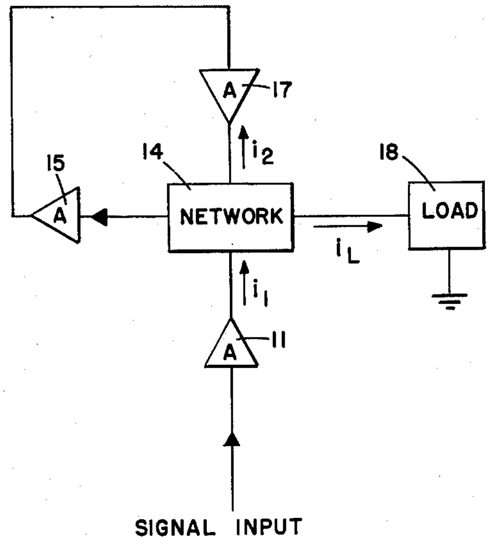

Referring now to FIG. 1, the basic operation of the device of this invention is illustrated in a block diagram. The signal input is fed to a first amplifier stage 11 which in turn has its output fed to network 14. Amplifier 15 has its input connected to network 14, and its output is fed to the input of amplifier 17. Network 14 is coupled to output load 18. To satisfy the operational requirements of the amplifier, i.e., to maintain balanced operation with zero quiescent current through the load with no input signal, the following equations must be satisfied:

$$i_1+i_2=i_0 \quad (1)$$

and $$i_L=i_1-i_2=2i_1-i_0 \quad (2)$$

where $i_1$ is the current flowing from amplifier stage 11 to network 14, $i_2$ is the current flowing between network 14 and amplifier 17, $i_0$ is a constant, and $i_L$ is the current flowing between network 14 and ground through load 18 in either direction. The satisfaction of Equation 1 and the maintenance of $i_0$ constant is accomplished by balance means comprising amplifier 15 and network 14. The details of how this feedback is accomplished will be explained in detail further on in the specification.

In the device of the invention the power amplifier stages 11 and 17 are biased to operate in class "A" condition, i.e., with current flowing through both amplifier stages at all times. The following description will assume such class "A" type operation.

Figure 2A:
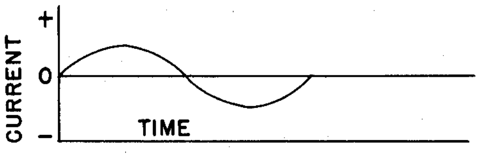
Figure 2B:
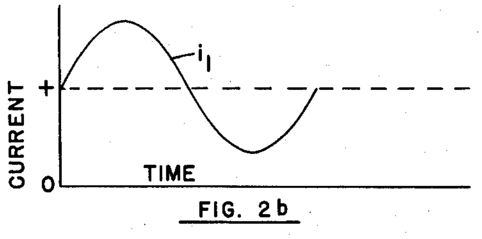
Figure 2C:
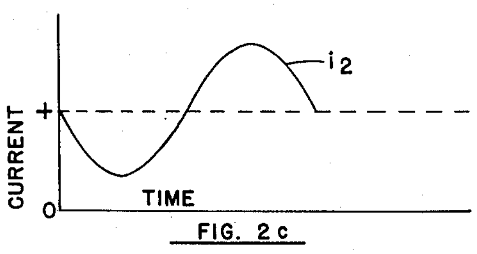
Figure 2D:
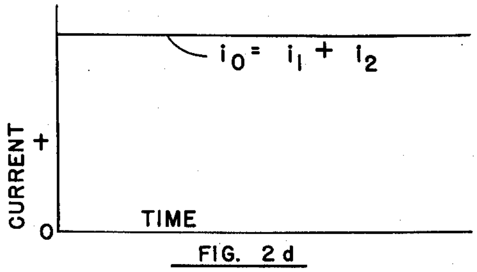

Referring now to FIGS. 2*a* through 2*e*, a series of waveforms illustrating the operation of the device of this invention are shown. FIG. 2*a* is a plot of current vs. time representing an input signal which may be fed, for example, to amplifier 11 as illustrated in FIG. 1. With such an input signal, FIG. 2*b* shows the current $i_1$ which may flow from amplifier 11 to network 14. It is to be noted that $i_1$ always flows in one direction which arbitrarily is represented as the positive direction. FIG. 2*c* illustrates the current flow $i_2$ which will flow from network 14 through amplifier 17. The current, $i_0$ as plotted in FIG. 2*d* represents the sum of $i_1$ and $i_2$ which as can be seen is maintained as a constant throughout the entire signal cycle. This condition will be maintained as long as current $i_2$ is made to decrease while current $i_1$ is increasing and vice-versa, the increases and decreases being maintained reciprocally equal to each other and about an equal quiescent operating point.

Figure 2E:
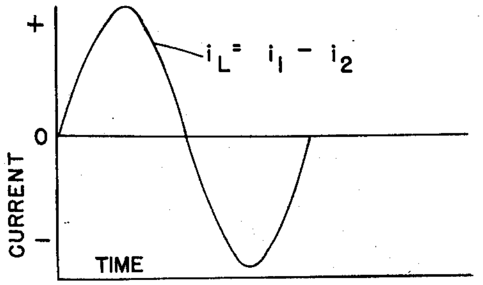

FIG. 2*e* illustrates the current $i_L$ which is the difference between $i_1$ and $i_2$. This represents the current which will flow through load 18 in either direction. As can be seen, $i_L$ is balanced having equal magnitude in both the positive and negative directions thereby faithfully reproducing the input signal shown in FIG. 2*a*. Such operation is achieved by maintaining $i_0$, the sum of $i_1$ and $i_2$, constant. As will be later explained, such operation is effectively achieved by means of the feedback circuitry of the device of the invention. It is to be noted, also, by reference to Equations 1 and 2 that because $i_1$ and $i_2$ flow through the load in opposite directions, when $$i_2=i_1=\frac{i_0}{2},\ i_L=0 \qquad (3)$$

satisfying quiescent operating condition requirements.

Figure 3:
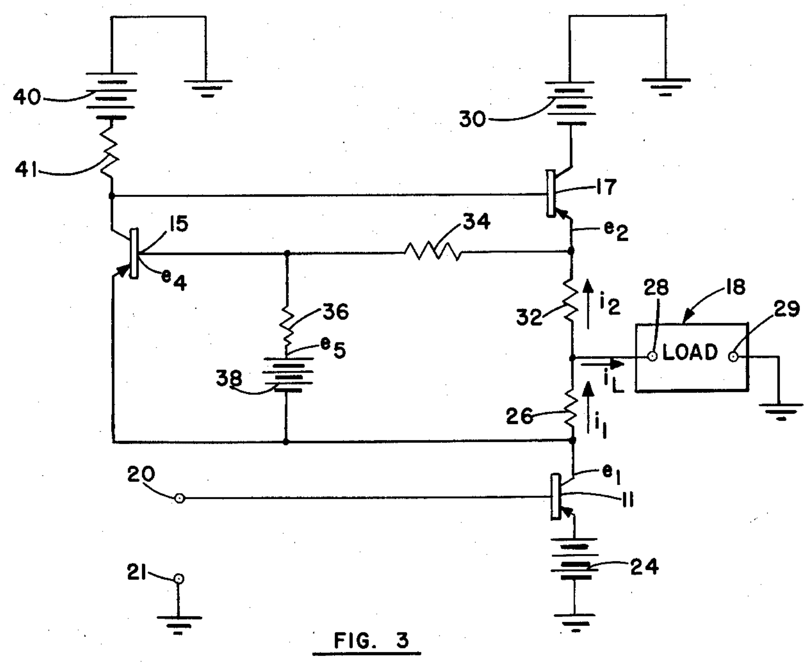
FIG. 3 is a schematic diagram of a first embodiment of the invention.

Referring now to FIG. 3, a first embodiment of the invention is illustrated in schematic form. Input signals are fed between terminals 20, 21, the latter of which is grounded, between the base of transistor 11 and ground. The emitter of transistor 11 is connected to the positive terminal of D.-C. power source 24, the negative terminal of this power source being grounded. The collector of transistor 11 is connected through resistor 26 to terminal 28 of output load 18. Terminal 29 of output load 18 is connected to ground. Transistor 17 has its collector connected to the negative terminal of power source 30, the positive terminal of this power source being connected to ground. The emitter of transistor 17 is connected through resistor 32 to terminal 28 of output load 18. The emitter of transistor 17 is also connected through resistor 34 to the base of transistor 15, the base of transistor 15 also being connected through resistor 36 to the positive terminal of power source 38. The emitter of transistor 15 is connected to the negative terminal of power source 38 and at the same time to the collector of transistor 11. The collector of transistor 15 is directly connected to the base of transistor 17. Power is supplied for transistor 15 from D.-C. power source 40, the negative terminal of this power source being connected through resistor 41 to the collector of transistor 15. The positive terminal of power source 40 is grounded.

The embodiment shown in FIG. 3 operates as follows: Input signals appearing between terminals 20 and 21 will drive transistor 11 causing it to conduct in accordance with such input signals. Transistor 11 is biased so as to operate in class "A" condition, i.e., it will have a quiescent D.-C. current with no signal between terminals 20 and 21 and will continue to conduct at all times through the complete cycle of the input signal fed between terminals 20 and 21. Transistor 11 being a PNP type will conduct with conventional current flow from its emitter to its collector in accordance with the input signals and at all times in the direction indicated by the arrow labeled $i_1$. This will cause an appropriate current flow through the output load from terminal 28 to terminal 29. The current $i_1$ through resistor 26 which comprises the current at the collector of transistor 11 is 180° out of phase with the input current fed between terminals 20 and 21. The current appearing at the collector of transistor 11 will drive the emitter of transistor 15 so as to produce a current at the collector of transistor 15 which will be in phase with the current at the collector of transistor 11 and 180° out of phase with the input current driving the base of transistor 11. Therefore, transistor 17 will have as its base driving signal a current which is 180° out of phase with the current fed to the base of transistor 11 and the net signal through the load (the algebraic difference between the two signals from transistors 11 and 17) follows the magnitude and direction of the input.

Transistor 17 is also a PNP type and such a signal will cause the current through transistor 17 to increase while the current through transistor 11 is decreasing and vice-versa, both transistors being driven in response to the input signals fed between terminals 20 and 21. The current flow through transistor 17 will be in the direction indicated by the arrow labeled $i_2$ which will manifest itself as a current flow (conventional current) from terminal 29 to terminal 28 of output load 18 which is the direction opposite to that of the current flow $i_1$ associated with transistor 11. Transistor 17 is also operated in class "A" condition.

The sum of the current $i_1$ and the current $i_2$, indicated in FIG. 3, is maintained constant as follows: The potential between the emitter of transistor 17 and the collector of transistor 11 is equal to $i_2r_2+i_1r_1$ where $r_2$ is the resistance of resistor 32 and $r_1$ is the resistance of resistor 26. If the potential at the base of transistor 15 which we may designate $e_4$ is the same as the potential at the collector of transistor 11 which may be designated $e_1$, which will be true with transistor 15 operating in class "A" condition (the voltage drop between the base and emitter of transistor 15 then being negligible), the base current of transistor 15 which may be designated as $i_b$ will be as follows:

$$i_b=\frac{-(e_2-e_1)}{r_3}-\frac{(e_5-e_1)}{r_4} \qquad (4)$$

where $e_2$ is the potential at the emitter of transistor 17, $e_1$ is the potential at the collector of transistor 11, $e_5$ is the potential at the positive terminal of D.-C. power source 38, $r_3$ is the resistance of resistor 34 and $r_4$ is the resistance of resistor 36. $e_5-e_1$ is the voltage across power source 38 which is a constant value; therefore the current produced by this voltage, $$\frac{e_5-e_1}{r_4}$$

is a constant. The portion of $i_b$ which flows through both transistors 15 and 17, $$\frac{e_2-e_1}{r_3}$$

controls the variation of $i_2$ in such a manner as to hold $e_2-e_1$ to a constant value provided that $i_b$ is very much less than $$\frac{e_5-e_1}{r_4}$$

which is the case for normal operation.

For example, if $i_b$, the base current of transistor 15 should increase with an increase in the negative direction of potential $e_2$ at the emitter of transistor 17 due to an increase in $i_2$, this will cause a corresponding increase in the collector current of transistor 15. Such an increase in collector current of PNP transistor 15 will tend to decrease the base current of transistor 17 which will in turn result in a decrease in $i_2$, the emitter current of this transistor. Such a decrease in $i_2$ will tend to make the potential $e_2$ less negative. This feedback action will thus tend to effectively prevent changes in the potential $e_2$ and thereby maintains $i_1+i_2$ constant.

The loop gain through transistors 15 and 17 and the network provided by resistors 34, 36, 32 and 26 can be made high enough to hold $e_2-e_1$ almost exactly to a constant value. If resistor 26, represented by $r_1$ and resistor 32, represented by $r_2$ are made equal to each other, then $$i_1+i_2=\frac{-(e_2-e_1)}{r_2}=i_0 \text{ (a constant value)} \qquad (5)$$

This equation represents the desired end result as indicated by Equation 1. Varying the input signal will cause any magnitude and direction of current to flow throughout the load up to the usual limitations of class "A" circuit design.

Figure 4:
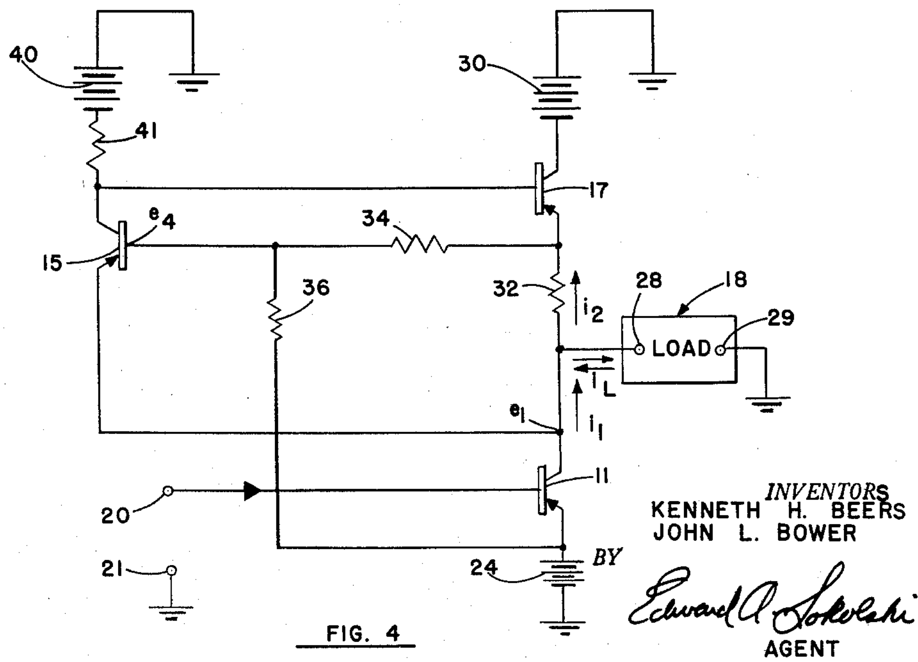
FIG. 4 is a schematic diagram of a second embodiment of the invention.

Referring now to FIG. 4, a second embodiment of the invention is illustrated in schematic form. This second embodiment is the same as the first except that D.-C. bias supply 38 has been eliminated as well as resistor 26 and the D.-C. bias for the operation of the feedback circuit supplied from power source 24 which also serves to provide operating power to transistor 11. Accordingly, resistor 36 is connected between the base of transistor 15 and power source 24. The operation of this second embodiment is similar to that of the first in maintaining the summed current $(i_1+i_2)$ constant. This second embodiment is not as effective in maintaining this constancy. It is to be noted, however, that this second embodiment eliminates the necessity for power source 38 and resistor 26. Accordingly, this embodiment may be used in less critical applications where the loss of performance with the elimination of these components is tolerable.

Figure 5:
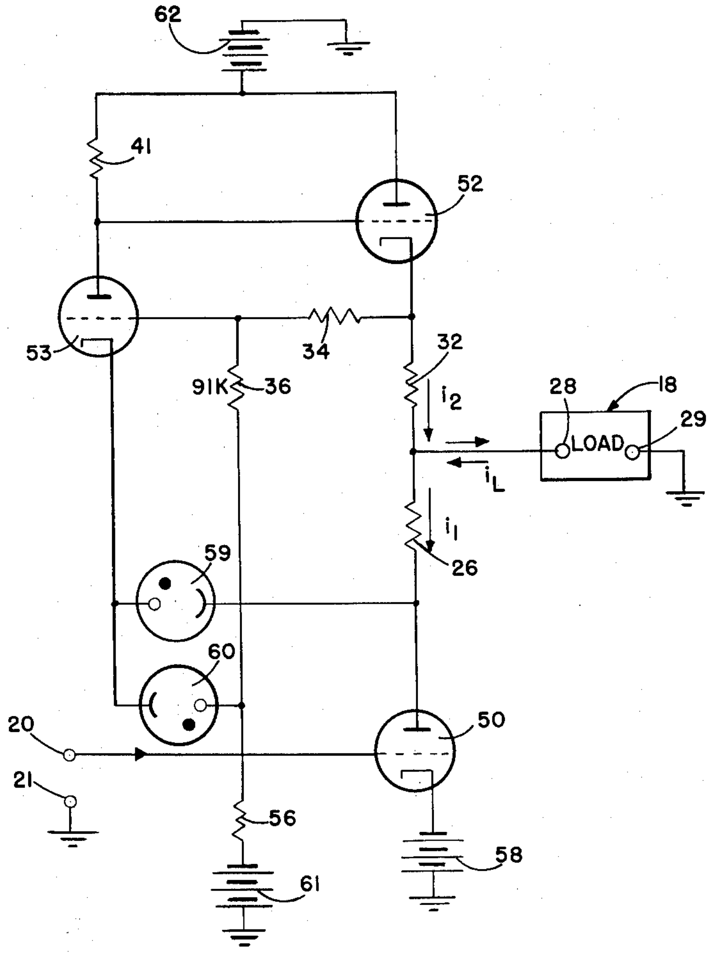
FIG. 5 is a schematic diagram of a third embodiment of the invention.

Referring now to FIG. 5, a third embodiment of the device of the invention analagous to the embodiment of FIG. 3 but which utilizes vacuum tubes in place of transistors is schematically illustrated. This embodiment operates similarly to the embodiment which is illustrated in FIG. 3, except that a voltage reference is provided by means of voltage regulating tubes 59 and 60 rather than by the D.-C. power source 38. A brief description of the operation of the vacuum tube version will be given, however, to clearly point out its operation.

Input signals are fed between terminals 20 and 21. These siignals are amplified by vacuum tube 50 causing a current flow $i_1$ throughout this vacuum tube and through resistor 26 and load 18. The input signal fed to the grid of tube 50 will produce at the plate a signal which is 180° out of phase with this input signal. This voltage is coupled through a gas regulator tube 59 to the cathode of vacuum tube 53 and will produce a voltage which is in phase with it at the plate of vacuum tube 53. This signal is coupled to the grid of vacuum tube 52 and being 180° out of phase with the signal coupled to the grid of vacuum 50 will produce a current flow through vacuum tube 52 which is 180° out of phase with the current flow through vacuum tube 50 (i.e., the current flow through vacuum tube 52 will increase as the current flow through tube 50 decreases and vice-versa). The current flow through vacuum tube 52 which is indicated in FIG. 5 by the arrow labeled $i_2$ will always flow in the direction indicated. The current flow through vacuum tube 50 will always be in the direction indicated by the arrow labeled $i_1$. The current $i_1$ will flow throughout the output load in the direction indicated by the lower arrow associated with "$i_L$," while the current $i_2$ will flow through the output load in the direction indicated by the upper arrow associated with label "$i_L$."

Voltage regulating tubes 59 and 60 provide a fixed voltage reference between the bottom end of resistor 36 and the plate of vacuum tube 50. Vacuum tube 53 is made to increase or decrease in conduction in response to the voltage between the plate of tube 50 and the cathode of tube 52 and thereby causes an increase or decrease in the conduction of vacuum tube 52 to maintain constant the summed current, $i_1+i_2$.

For example, if $i_1+i_2$ should change with a decrease in the potential between the cathode of tube 52 and the plate of tube 50, there will be a decrease in the potential between the grid and cathode of vacuum tube 53. Tube 53 will therefore conduct less which will increase the voltage at its plate, thereby tending to cause vacuum tube 52 to conduct more heavily to increase $i_2$ and restore the voltage between the cathode of vacuum tube 52 and the plate of vacuum tube 50 to its original potential. As indicated by Equation 5, this will restore $i_1+i_2$ to its original magnitude. Thus, it can be seen that the vacuum tube embodiment shown in FIG. 5 will operate similarly to the previously illustrated and described embodiments.

Typical component values for the embodiment illustrated in FIG. 3 might be as follows:

| | |
|---|---|
| Transistors **11** and **17** | Type 2N277. |
| Transistor **15** | Type 2N319. |
| Resistors **26** and **32** | 1 ohm, 1%. |
| Resistor **34** | 43 ohms, 1%. |
| Resistor **36** | 130 ohms, 1%. |
| Resistor **41** | 2.2 kilohms. |
| Power source **38** | 4.5 volts. |
| Power sources **24** and **30** | 18 volts. |
| Power source **40** | 50 volts. |

Typical component values for the embodiment illustrated in FIG. 5 might be as follows:

| | |
|---|---|
| Vacuum tube **50** and **52** | Type 6AS7. |
| Vacuum tube **53** | Type 6C4. |
| Regulator tubes **59** and **60** | Type VR90. |
| Resistor **41** | 12 kilohms. |
| Resistor **56** | 8.2 kilohms. |
| Resistor **36** | 91 kilohms. |
| Resistor **34** | 110 kilohms. |
| Resistors **26** and **32** | 100 ohms. |
| Power sources **58** and **62** | 100 volts. |
| Power source **61** | 350 volts. |

It is to be noted that while the embodiments illustrated in FIGS. 3 and 4 are shown using PNP type transistors, NPN type transistors can be utilized if the polarity connections of the power supplies are appropriately changed in accordance with standard engineering practice.

Although the invention has been described and illustrated in detail, it is to be clearly understood that the same is by way of illustration and example only and is not to be taken by way of limitation, the spirit and scope of this invention being limited only by the terms of the appended claims.

We claim:

1. A single ended load, first electronic D.-C. amplifying circuit means for providing a first current flow through said load in a first direction, second electronic D.-C. amplifying circuit means for providing a second current flow through said load in a direction opposite said first direction, and balance means responsive to the sum of the magnitude of said first and second current flows connected between said first and second circuit means for controlling one of said circuit means to maintain said sum of said current flows constant, said balance means including a D.-C. reference source connected between said first and second circuit means.

2. In combination, first and second similar D.-C. electronic power amplifier stages, means for coupling an input signal to said first power amplifier stage, a single ended output load coupled to said power amplifier stages to receive output current therefrom, the output current flow from said first power amplifier through said load being opposite in direction to the current flow through said load from said second power amplifier, and feedback means for maintaining constant the sum of the current flows from said first power amplifier to said load and from said second power amplifier to said load, said feedback means being connected between said first and second power amplifiers, said feedback means including a network comprising a D.-C. reference source coupled between the outputs of said power amplifier stages and a control amplifier, the input of said control amplifier being connected to said network, the output of said control amplifier being connected to the input of said second power amplifier, the output of said control amplifier being 180° out of phase with the input signal to said first power amplifier.

3. In a D.-C. power amplifier, first, second and third transistors, a two terminal output load, a first impedance connected between the collector of said first transistor and one terminal of said load, a second impedance connected between the emitter of said second transistor and said one terminal of said load, a first power source connected between the collector of said second transistor and ground, a second power source connected between the emitter of said first transistor and ground, a pair of input terminals, one of said input terminals being connected to the base of said first transistor, the other of said input terminals being connected to ground, a third impedance connected between the emitter of said second transistor and the base of said third transistor, a voltage reference source, a fourth impedance connected between the base of said third transistor and one terminal of said voltage reference source, the other terminal of said voltage reference source being commonly connected to the emitter of said third transistor and the collector of said first transistor, the collector of said third transistor being connected to the base of said second transistor, a third power source, and a fifth impedance connected between one terminal of said third power source and the collector of said third transistor, the other terminal of said third power source being connected to ground.

4. In a D.-C. power amplifier, first, second and third vacuum tubes each having at least a cathode, a plate and a grid, a two terminal output load, a first impedance connected between the plate of said first tube and one terminal of said load, a second impedance connected between the cathode of said second tube and said one terminal of said load, a first power source connected between the plate of said second tube and ground, a second power source connected between the cathode of said first tube and ground, a pair of input terminals, one of said input terminals being connected to the grid of said first tube, the other of said input terminals being connected to ground, a third impedance connected between the cathode of said second tube and the grid of said third tube, a voltage reference source having three terminals, a fourth impedance connected between the grid of said third tube and a first terminal of said voltage reference source, a second terminal of said voltage reference source being connected to the cathode of said third tube, the third terminal of said voltage reference source being connected to the plate of said first tube, the plate of said third tube being connected to the grid of said second tube, and a fifth impedance connected between the plate of said third tube and the first power source.

5. A D.-C. power amplifier comprising first and second similar type electronic valves each having a control electrode, a current input electrode and a current output electrode, power source means connected between the current input and current output electrodes of said first and second valves for causing current flow in said first and second valves, means for coupling an input signal to said first valve, a load having at least two terminals, the current output electrode of said first electronic valve and the current input electrode of said second electronic valve being coupled to one terminal of said load, and means for maintaining constant the sum of the current flows between said first valve and said one output load terminal and said second valve and said one output load terminal comprising a third electronic valve having a control electrode, a current input electrode and a current output electrode, a source of constant voltage connected between the control electrode and the current input electrode of said third valve and resistive means connected between the current input electrode of said second valve and the control electrode of said third valve, the current output electrode of said third valve being connected to the control electrode of said second valve, the signal fed from said third valve to said second valve being 180° out of phase with the input signal to said first valve.

6. In a D.-C. power amplifier, first and second transistors, first and second D.-C. power sources, each having a pair of terminals connected between the emitter and collector of said first and second transistors respectively, an output load having first and second terminals, the collector of said first transistor being coupled to said first terminal of said load to cause current flow through said load in one direction, the emitter of said second valve being coupled to said first terminal of said load to cause current flow through said load in a direction opposite to said one direction, said second terminal of said load being connected to one of the terminals of each of said power sources, means for coupling an input signal to the base of said first transistor, and means coupled between said first and second transistors for maintaining constant the sum of the current flowing between said first transistor and said first load terminal and the current flowing between said second transistor and said first load terminal, said means coupled between said transistors comprising a source of constant voltage, and a third transistor, said source of constant voltage being coupled between the emitter and base of said third transistor, the base of said third transistor further being coupled to the emitter of said second transistor, the collector of said third transistor being connected to the base of said second transistor, the signal fed from said third transistor to said second transistor being 180° out of phase with the input signal coupled to said first transistor.

References Cited in the file of this patent

UNITED STATES PATENTS

| | | |
|---|---|---|
| 2,326,614 | Bowman | Aug. 10, 1943 |
| 2,658,117 | Sunstein | Nov. 3, 1953 |
| 2,737,547 | Deming | Mar. 6, 1956 |
| 2,884,492 | Swain | Apr. 28, 1959 |

OTHER REFERENCES

Aronson: "Transformerless Transistorized A-F Power Amplifier Has 7-W Output," Instruments and Automation, August 1958, page 1371.